United States Patent
Xu et al.

(10) Patent No.: US 8,824,984 B2
(45) Date of Patent: Sep. 2, 2014

(54) OUTPHASING POWER COMBINING BY ANTENNA

(75) Inventors: Hongtao Xu, Beaverton, OR (US); Hemasundar M. Geddada, College Station, TX (US); Chang-Tsung Fu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 13/537,103

(22) Filed: Jun. 29, 2012

(65) Prior Publication Data

US 2014/0002182 A1    Jan. 2, 2014

(51) Int. Cl.
*H01Q 11/12* (2006.01)
*H04B 1/04* (2006.01)

(52) U.S. Cl.
USPC .................. 455/127.1; 455/126; 455/129

(58) Field of Classification Search
CPC ...... H03G 3/3042; H03G 3/3047; H03F 3/24; H04B 7/0617; H04B 1/04
USPC ...................... 455/126, 127.1, 129
See application file for complete search history.

(56) References Cited

U.S. PATENT DOCUMENTS

| | | | |
|---|---|---|---|
| 7,260,368 B1 * | 8/2007 | Blumer | 455/108 |
| 2003/0214448 A1 | 11/2003 | Downs | |
| 2004/0266365 A1 | 12/2004 | Hasson et al. | |
| 2005/0073374 A1 | 4/2005 | Korol | |
| 2005/0136864 A1 * | 6/2005 | Zipper | 455/127.1 |
| 2006/0241422 A1 * | 10/2006 | Muratayev et al. | 600/435 |
| 2010/0216419 A1 | 8/2010 | Kanasaki et al. | |

OTHER PUBLICATIONS

International Search Report received for PCT Patent Application No. PCT/US2013/146647, mailed Sep. 2, 2013, 17 pages.

* cited by examiner

*Primary Examiner* — Nhan Le
(74) *Attorney, Agent, or Firm* — Kacvinsky Daisak Bluni PLLC (57) ABSTRACT

Examples are disclosed for outphasing power combining by antenna. In some examples, a device such as a wireless device may route a first signal to a first branch of an outphasing power amplifier system and route a second signal to a second outphasing power amplifier system. The outputs of the first branch and the second branch may be directly coupled to an antenna. The antenna may be arranged to operate as a power combiner for signals outputted from the first and the second branches of the outphasing power amplifier system. A power combined signal may then be transmitted from the antenna. Other examples are described and claimed.

5 Claims, 10 Drawing Sheets

- AMPLIFY A FIRST SIGNAL USING A FIRST OUTPHASING PA
  *602*
- AMPLIFY A SECOND SIGNAL USING A SECOND OUTPHASING PA
  *604*

COMBINE POWER OUTPUTS OF THE FIRST AND SECOND OUTPHASING PAS
*606*

> USE A DIPOLE ANTENNA ARRANGED TO COUPLE DIRECTLY TO THE OUTPUTS OF THE FIRST AND SECOND OUTPHASING PAS
> *608*

TRANSMIT THE POWER COMBINED SIGNALS AS MODULATED SIGNALS VIA THE DIPOLE ANTENNA
*610*

Storage Medium 800

*Computer Executable Instructions for 600*

*Computer Executable Instructions for 700*

OUTPHASING POWER COMBINING BY ANTENNA

BACKGROUND

High data rate wireless communication standards or specification such as those deployed for networks using orthogonal frequency division multiplexing (OFDM) technologies may require high output linearity over a wide dynamic range for transmitted signals. Typically, for a wireless device to acceptably implement OFDM technologies, several backoff decibels (dBs) (e.g., 7 dBs) from a peak power radiation level are required for transmitting signals from the wireless device. High output linearity over a wide dynamic range using radio frequency power amplifiers may be a design challenge for wireless devices that implement OFDM technologies and have several backoff dBs from a peak power radiation level for transmitting signals. It is with respect to these and other challenges that the present improvements are needed.

DETAILED DESCRIPTION

Examples are generally directed to improvements for wireless mobile broadband technologies. Wireless mobile broadband technologies may include any wireless technologies suitable for use with wireless devices or user equipment (UE), such as one or more third generation (3G) or fourth generation (4G) wireless standards, revisions, progeny and variants. Examples of wireless mobile broadband technologies may include without limitation any of the Institute of Electrical and Electronics Engineers (IEEE) 802.16m and 802.16p standards, 3rd Generation Partnership Project (3GPP) Long Term Evolution (LTE) and LTE-Advanced (LTE-A) standards, and International Mobile Telecommunications Advanced (IMT-ADV) standards, including their revisions, progeny and variants. Other suitable examples may include without limitation Global System for Mobile Communications (GSM)/Enhanced Data Rates for GSM Evolution (EDGE) technologies, Universal Mobile Telecommunications System (UMTS)/High Speed Packet Access (HSPA) technologies, Worldwide Interoperability for Microwave Access (WiMAX) or the WiMAX II technologies, Code Division Multiple Access (CDMA) 2000 system technologies (e.g., CDMA2000 1xRTT, CDMA2000 EV-DO, CDMA EV-DV, and so forth), High Performance Radio Metropolitan Area Network (HIPERMAN) technologies as defined by the European Telecommunications Standards Institute (ETSI) Broadband Radio Access Networks (BRAN), Wireless Broadband (WiBro) technologies, GSM with General Packet Radio Service (GPRS) system (GSM/GPRS) technologies, High Speed Downlink Packet Access (HSDPA) technologies, High Speed Orthogonal Frequency-Division Multiplexing (OFDM) Packet Access (HSOPA) technologies, High-Speed Uplink Packet Access (HSUPA) system technologies, 3GPP Rel. 8, 9 or 10 of LTE/System Architecture Evolution (SAE), and so forth. The examples are not limited in this context.

By way of example and not limitation, various examples may be described with specific reference to various 3GPP LTE and LTE-A standards, such as the 3GPP LTE Evolved UMTS Terrestrial Radio Access Network (E-UTRAN), Universal Terrestrial Radio Access (E-UTRA) and LTE ADV Radio Technology 36 Series of Technical Specifications (collectively "3GPP LTE specifications"), and IEEE 802.16 standards, such as the IEEE 802.16-2009 standard and current third revision to IEEE 802.16 referred to as "802.16Rev3" consolidating standards 802.16-2009, 802.16h-2010 and 802.16m-2011, and the IEEE 802.16p draft standards including IEEE P802.16.1b/D2 January 2012 titled "Draft Amendment to IEEE Standard for WirelessMAN-Advanced Air Interface for Broadband Wireless Access Systems, Enhancements to Support Machine-to-Machine Applications" (collectively "IEEE 802.16 standards"), and any drafts, revisions or variants of the 3GPP LTE specifications and the IEEE 802.16 standards. Although some embodiments may be described as a 3GPP LTE specifications or IEEE 802.16 Standards system by way of example and not limitation, it may be appreciated that other types of communications system may be implemented as various other types of mobile broadband communications systems and standards. The examples are not limited in this context As contemplated in the present disclosure, high output linearity over a wide dynamic range using radio frequency power amplifiers may be a design challenge for wireless devices that implement OFDM technologies (e.g., LTE, LTE-A, WiFi or WiMax). Also, as mentioned previously, several backoff dBs from a peak power radiation level may also present design challenges. Outphasing power amplification techniques may be one possible design solution deployed to enhance power efficiency of wireless devices that implement OFDM technologies at these types of backoff dBs. A wireless device deploying outphasing power amplification techniques may include logic and/or features to decompose a signal (e.g., according to its amplitude and phase information) into two digital signals that may be phase modulated. The two digital signals may then be inputted to two separate switching type power amplifiers. The power outputs from these two separate switching type power amplifiers ("outphasing power amplifiers") are combined and then outputted via an antenna for the wireless device.

Typically a power combiner may be implemented on-chip with outphasing power amplifiers. On-chip power combiners may be either isolating or non-isolating and may require a significant amount of die area relative to the die area needed for the outphasing power amplifiers. Off-chip power combiners may be used, but manufacturing costs may unacceptably increase by adding additional off-chip components to a wireless device. Also, on-chip or off-chip power combiners may consume a substantial amount of power in a wireless device that utilizes outphasing power amplifiers.

In some examples, techniques may be implemented for outphasing power combining by antenna. For these examples, a first signal may be generated by logic and/or features of a wireless device and routed to a first branch of an outphasing power amplifier system. A second signal may also be generated by the logic and/or features of the wireless device and routed to a second branch of the outphasing power amplifier system. The outputs of the first branch and the second branch may be configurable to couple directly to an antenna arranged to operate as a power combiner for signals outputted from the first and the second branches. In some examples, the antenna may be a dipole antenna or a dual folded dipole antenna.

Figure 1:
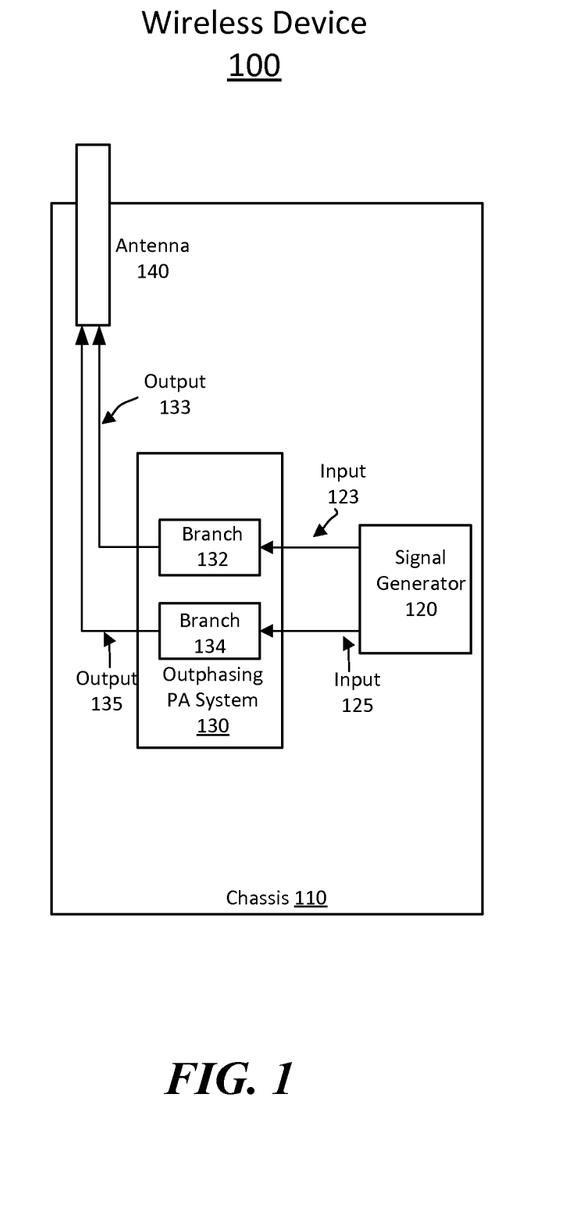
FIG. 1 illustrates an example of a wireless device.

FIG. 1 illustrates an example of a wireless device 100. In some examples, as shown in FIG. 1, wireless device 100 includes a chassis 110, a signal generator 120, an outphasing power amplifier (PA) system 130 and an antenna 140. Also as shown in FIG. 1, inputs 123 and 125 may route signals generated by signal generator 120 to branches 132 and 134, respectively, of outphasing PA system 130. Also, outputs 133 and 135 may route signals outputted from branches 132 and 134, respectively, to antenna 140. Only a portion of components or systems of wireless device 100 are shown in FIG. 1. Other components or systems to include, for example, a display, a keyboard, memory, etc. are not shown in order to more clearly describe outphasing power combining by antenna. Examples are not limited to the configuration shown in FIG. 1.

According to some examples, branches 132 and 134 may each include one or more outphasing PAs to amplify signals generated by signal generator 120. The signals amplified may include encoded information associated with data to be transmitted from wireless device 100. For these examples, input 123 may route or convey signals generated by signal generator 120 to the one or more outphasing PAs included in branch 132. Also, input 125 may route or convey signals generated by signal generator 120 to the one or more outphasing PAs included in branch 132.

In some examples, as shown in FIG. 1, the outputs of branches 132 and 134 couple directly to antenna 140. For these examples, antenna 140 may be arranged to function or serve as a power combiner for amplified signals outputted from branches 132 and 134. As described more below, types of antennas such a dipole antennas or dual folded dipole antennas may be arranged to enable transmission of power combined signals via these types of antennas. As a result of coupling directly to antenna 140, a separate power combiner component may not be needed for wireless device 100.

According to some examples, wireless device 100 may be any electronic device having wireless capabilities or equipment. For some examples wireless device 100 may be implemented in a fixed device. A fixed device generally refers to an electronic device designed to be in a fixed, stationary, permanent or otherwise non-moving position or location that does not vary over time. For instance, a fixed device may be installed with fixtures, attachments and housings to prohibit movement, including wired power lines, transmission lines, and so forth. By way of contrast, a mobile device is designed to be portable enough to be frequently moved between various locations over time. It may be appreciated that although a fixed device is generally stationary, some fixed devices may be disconnected from their current equipment in a first fixed location, moved to a second fixed location, and connected to equipment at the second fixed location.

Figure 2:
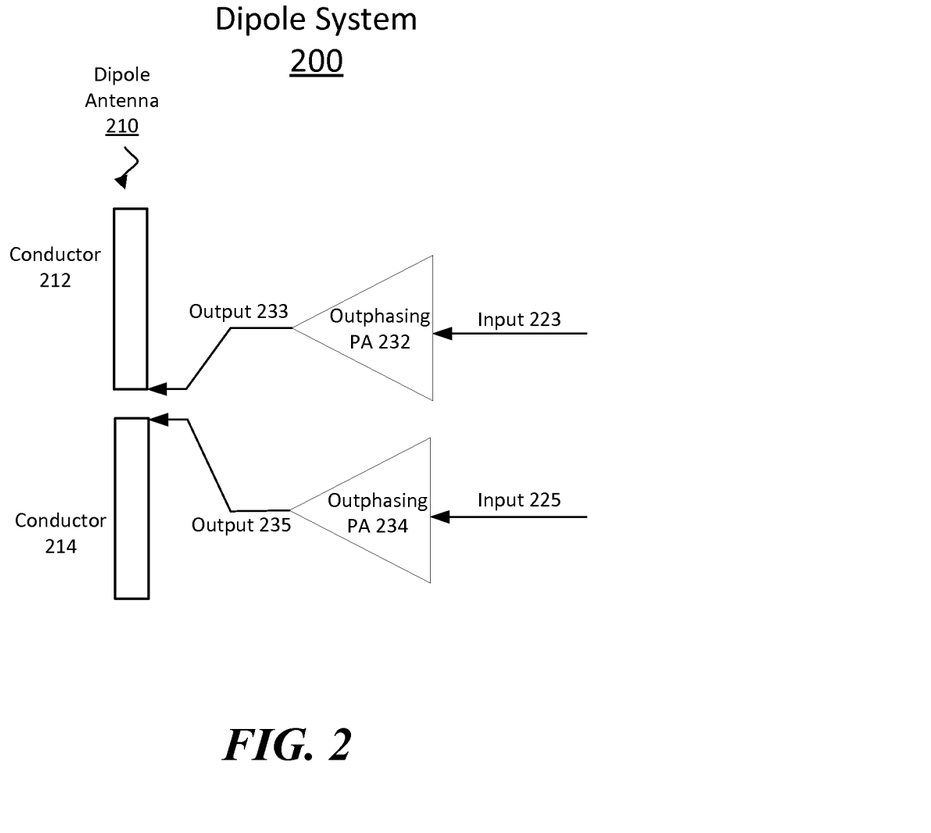
FIG. 2 illustrates an example of a dipole system.

FIG. 2 illustrates an example dipole system 200. According to some examples, as shown in FIG. 2, dipole system 200 includes a dipole antenna 210 and outphasing PAs 232 and 234. For these examples, outphasing PAs 232 and 234 may be branches of an outphasing PA system having inputs 223 and 225 and outputs 233 and 235. Also, as shown in FIG. 2, outputs 233 and 235 are shown as coupling directly to conductors 212 and 214 of dipole antenna 210.

In some examples, first and second signals may be generated (e.g., by a signal generator). The first signal may be routed to outphasing PA 232 via input 223. The second signal may be routed to outphasing PA 234 via 225. As described more below, the first and second signals may be amplified by adjusting the relative phases associated with voltage or power vectors for each of the signals. The power outputs of the amplified first and second signals may then be combined via direct coupling of output 233 to conductor 212 and output 235 to conductor 214. The power combined signals may then be transmitted via dipole antenna 210.

According to some examples, logic and/or features of a wireless device including a dipole system 200 may generate and/or cause the power combined signals to be transmitted as modulated signals through dipole antenna 210. For these examples, the transmitted modulated signals may include, but are not limited to, orthogonal frequency-division multiplexing (OFDM) modulated signals.

Figure 3:
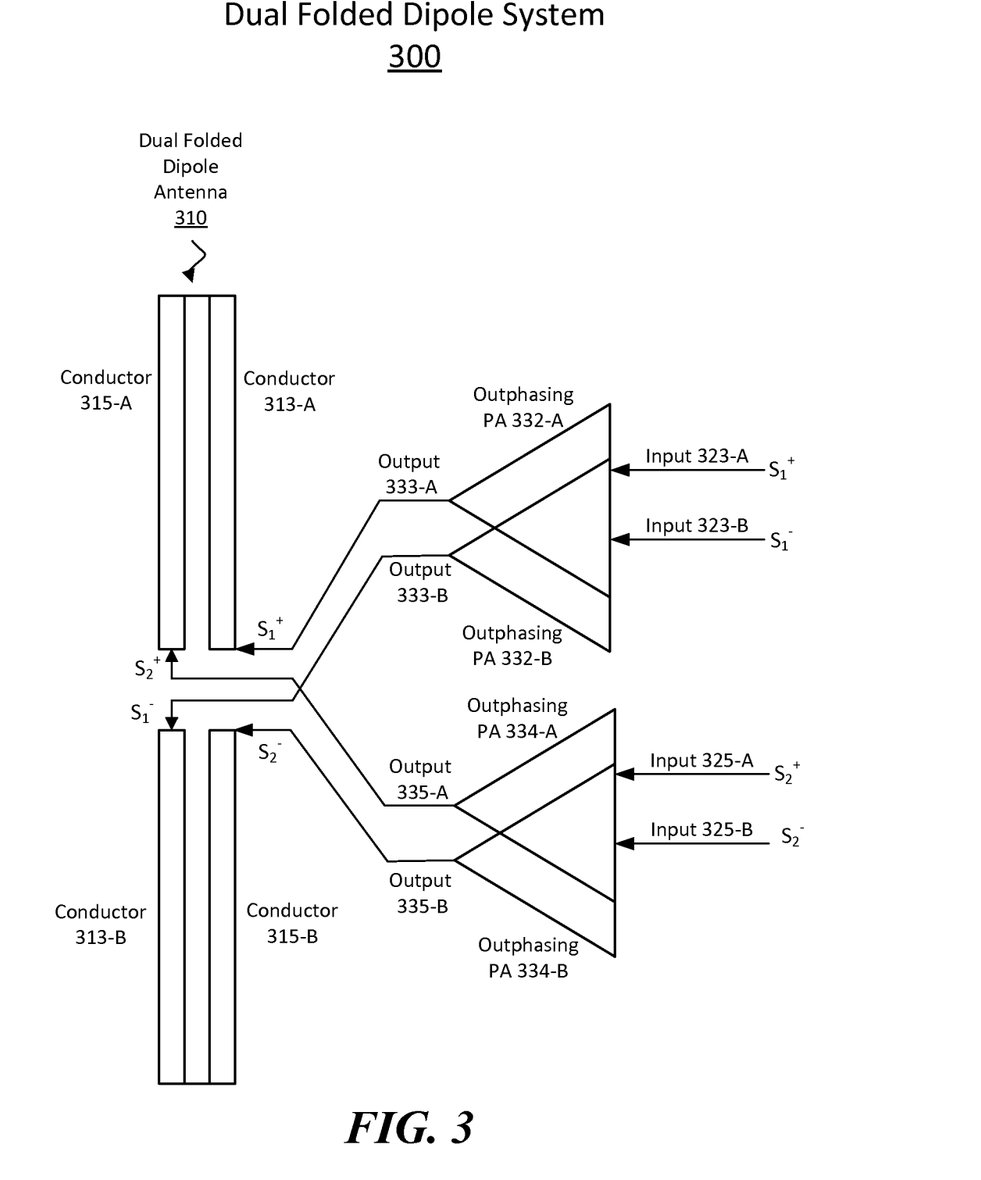
FIG. 3 illustrates an example of a dual folded dipole system.

FIG. 3 illustrates an example of a dual folded dipole system 300. In some examples, as shown in FIG. 3, a dual folded dipole system includes a dual folded dipole antenna 310 and two pairs of outphasing PAs. For these examples, the first pair includes outphasing PAs 332-A/B and the second pair includes outphasing PAs 334-A/B. These pairs may each be branches of an outphasing PA system. Also, as shown in FIG. 3, outphasing PAs 332-A/B have inputs 323-A/B and outphasing PAs 334-A/B have inputs 325-A/B. FIG. 3 further shows outputs 333-A/B coupling directly to conductors 313-A/B and output 315-A/B coupling directly to conductors 315-A/B.

According to some examples, differential signals may be generated and inputted to each of the pairs of the outphasing PAs included in dual folded dipole system 300. These differential signals are depicted in FIG. 3 as $S_1^+/S_1^-$ and $S_2^+/S_2^-$. For these examples, as shown in FIG. 3, the positive portions of each of the amplified differential signals outputted from the pairs of outphasing PAs are routed to conductors 313-A and 315-A. Meanwhile, the negative portions are routed to conductors 313-B and 315-B. In other words, the positive portions of the two differential signals are routed to the upper portion of dual folded dipole antenna 310 and the negative portions are routed to the lower portion.

In some examples, first and second differential signals (e.g., $S_1^+/S_1^-$ and $S_2^+/S_2^-$) may be generated (e.g., by a signal generator). The first differential signal may be routed to outphasing PAs 332-A/B via inputs 323-A/B. The second differential signals may be routed to outphasing PAs 334-A/B via inputs 325-A/B. The first and second differential signals may be amplified by adjusting the relative phases of these differential signals and the power outputs of the amplified first and second differential signals may then be combined via direct coupling of outputs 333-A/B to conductors 313-A/B and outputs 335-A/B to conductors 315-A/B. The power combined signals may then be transmitted via dual folded dipole antenna 310.

According to some examples, logic and/or features of a wireless device including a dual folded dipole system 300 may generate and/or cause the power combined signals to be transmitted as modulated signals through dual folded dipole antenna 310. For these examples, the transmitted modulated signals may include, but are not limited to, OFDM modulated signals.

In some examples, differential signals may be implemented in PAs constructed using complementary metal-oxide-semiconductor (CMOS) technologies. The CMOS PAs may experience signal interference from other components. Use of differential signals may reduce or eliminate signal interference and may enable these CMOS PAs to amplify inputted signals that may be received or inputted at relatively low power levels.

According to some examples, conductors 313-A/B and 315-A/B may have a shorted terminal folded dipole with length that is ¼th the wavelength (λ/4) of the average signal frequencies for amplified signals to be transmitted using dual folded dipole antenna 310. For these examples, having a length of λ/4 may enable adequate open to folded dipole inputs when transmitted signals are driven by outphased power amplified signals. Also, an acceptable minimum radiation power level may be maintained for these transmitted signals.

Figure 4:
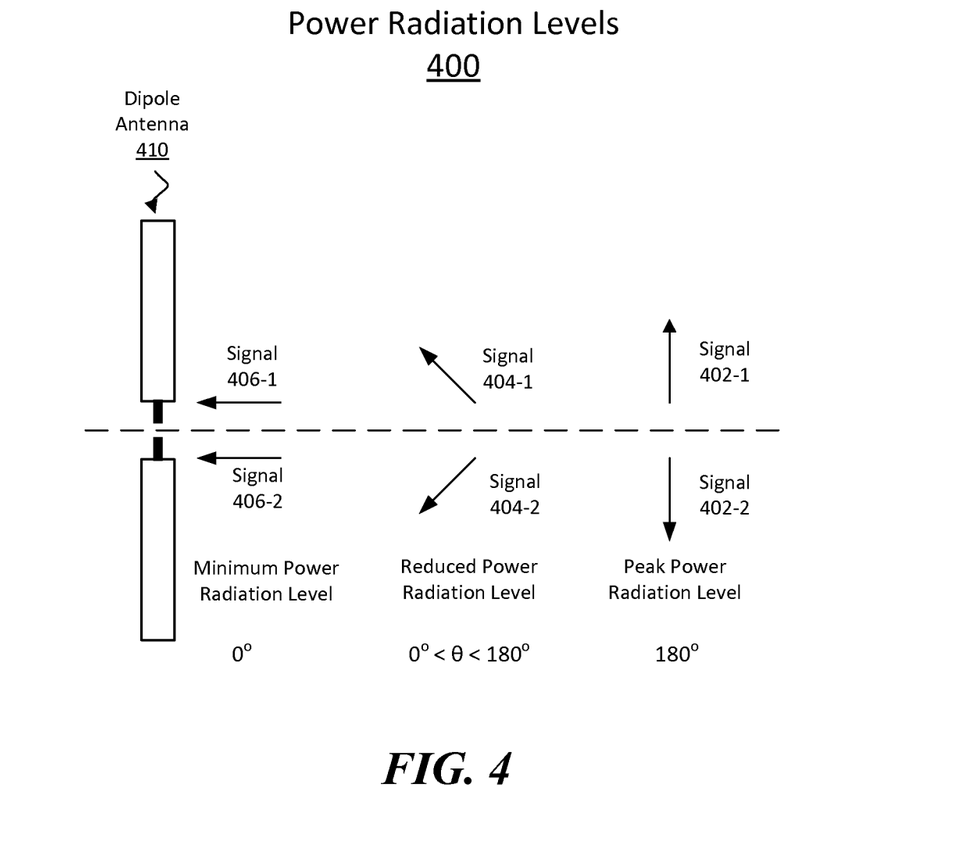
FIG. 4 illustrates an example of power radiation levels.

FIG. 4 illustrates an example of power radiation levels 400. In some examples, as shown in FIG. 4, outphasing amplifiers such as those shown in FIG. 2 may amplify inputted signals by adjusting the relative phases associated with voltage or power vectors for each of the signals. For example, FIG. 4 shows that for signals 402-1 and 402-2 a peak power radiation level may result when these signals are in an anti-phase relationship. The anti-phase relationship, for example, may include signal 402-1 having an outphasing angle (θ) of +90° and signal 402-2 having a θ of −90°. In an anti-phase relationship, dipole antenna 410 provides a level of impedance to outphasing PAs that allows for a peak power radiation level for power combined signals transmitted via dipole antenna 410. Conversely, when signals are in an in-phase relationship such as signals 406-1 and 406-2, dipole antenna 410 may have very high impedance and thus appear as an open circuit. The in-phase relationship may therefore result in a minimum power radiation level. Power radiation levels 400 also depicts that for signals 404-1 and 404-2 having a θ between 0° and 180°, a reduced power radiation level may result.

Although not shown in FIG. 4, similar power radiation levels may occur for differential signals amplified by pairs of outphasing PAs that are output directly to a dual folded dipole antenna such as dual folded dipole antenna 310 shown in FIG. 3 and then combined. For these power radiation levels, an anti-phase relationship between two differential signals may result in a peak power radiation level. Meanwhile, an in-phase relationship may result in a minimum power radiation level.

Figure 5:
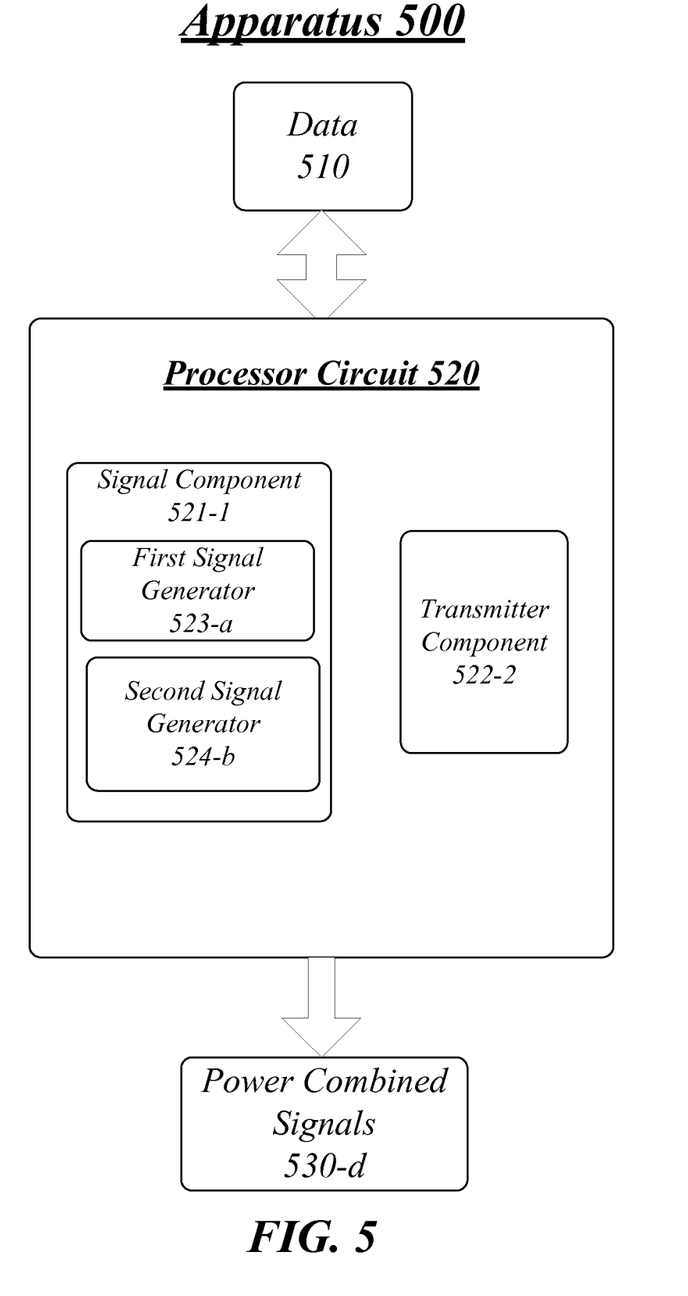
FIG. 5 illustrates an example apparatus.

FIG. 5 illustrates a block diagram for an apparatus 500. Although the apparatus 500 shown in FIG. 5 has a limited number of elements in a certain topology, it may be appreciated that the apparatus 500 may include more or less elements in alternate topologies as desired for a given implementation.

The apparatus 500 may comprise a computer-implemented apparatus 500 having a processor circuit 520 arranged to execute one or more software components 522-a. It is worthy to note that "a" and "b" and "c" and similar designators as used herein are intended to be variables representing any positive integer. Thus, for example, if an implementation sets a value for a=5, then a complete set of software components 522-a may include components 522-1, 522-2, 522-3, 522-4 and 522-5. The embodiments are not limited in this context.

According to some examples, apparatus 500 may be located with a wireless device (e.g., located at or with wireless device 100). For these examples, the wireless device including apparatus 500 may implement OFDM technologies (e.g., LTE, LTE-A, WiFi or WiMax) to communicatively couple to a wireless network.

In some examples, as shown in FIG. 5, apparatus 500 includes processor circuit 520. Processor circuit 520 may be generally arranged to execute one or more software components 522-a. The processing circuit 520 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Core i3, Core i5, Core i7, Itanium®, Pentium®, Xeon®, and XScale® processors; and similar processors. Dual microprocessors, multi-core processors, and other multi-processor architectures may also be employed as processing circuit 520.

According to some examples, apparatus 500 may include a signal component 522-1. Signal component 522-1 may be arranged for execution by processor circuit 520 to cause first and second signals to be generated. The generated signals, for example, may encode data 510. For these examples, signal component 521-1 may cause first signal generator 523-a to generate a first signal. Also, signal component 521-1 may cause second signal generator 524-b to generate a second signal. These first and second generated signals may include either non-differential signals or differential signals.

In some examples, apparatus 500 may also include a transmitter component 522-2. Transmitter component 522-2 may be arranged for execution by processor circuit 520 to cause the signals generated by signal components 521-1 and 521-2 to be routed through branches of an outphasing PA. For these examples, the first signal may be routed to a first branch of an outphasing PA system such as outphasing PA system 130 shown in FIG. 1. Also, the second signal may be routed to a second branch of the outphasing PA system. The outputs of the branches of this outphasing PA system may directly couple to an antenna (e.g., dipole antenna or dual folded dipole antenna) arranged to operate as a power combiner for the signals outputted from the first and the second branches. Power combined signals 530-d may then be transmitted from this antenna.

According to some examples, transmitter component 522-2 may be arranged to cause power combined signals 530-d to be transmitted as modulated signals to include OFDM modulated signals. Also, the modulated power combined signals 530-d may be transmitted at a peak power radiation level based on the first signal being anti-phase relative to the second signal. The modulated power combined signals 530-d may also be transmitted at a minimum power radiation level based on the first signal being in-phase relative to the second signal.

Various components of apparatus 500 and a wireless device implementing apparatus 500 may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Example connections include parallel interfaces, serial interfaces, and bus interfaces.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

Figure 6:
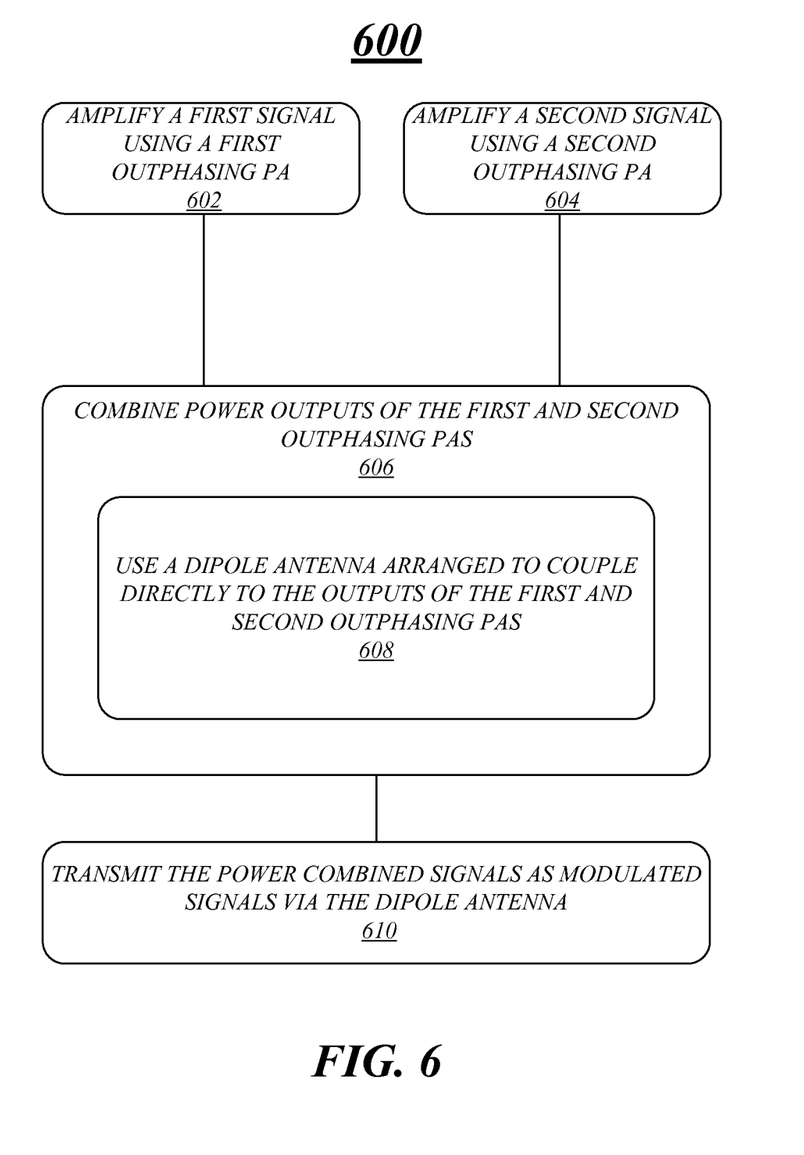
FIG. 6 illustrates an example of a first logic flow.

FIG. 6 illustrates an example of a logic flow 600. Logic flow 600 may be representative of some or all of the operations executed by one or more logic, features, or devices described herein, such as apparatus 500. More particularly, logic flow 600 may be implemented by signal component 522-1 or transmitter component 522-2.

In the illustrated example shown in FIG. 6, logic flow 600 may amplify a first signal using a first outphasing PA at block 602. In some examples, signal component 522-1 of apparatus 500 (e.g., included in wireless device 110) may be arranged to cause the first signal to be generated and transmitter component 522-2 may cause the generated first signal to be routed through the first outphasing PA.

In some examples, logic flow 600 at block 604 may amplify a second signal using a second outphasing PA. In some examples, signal component 522-1 may be arranged to cause the second signal to be generated and transmitter component 522-2 may cause the generated second signal to be routed through the second outphasing PA. As shown in FIG. 6, blocks 602 and 604 may occur in parallel. In other words, logic flow 600 may amplify the first and second signals at substantially the same time.

According to some examples, logic flow 600 may combine power outputs of the first and second outphasing PAs at block 606. For these examples, logic flow at block 608 may use a dipole antenna arranged to couple directly to the outputs of the first and second outphasing PAs to combine the power outputs.

According to some examples logic flow 600 at block 610 may transmit the power combined signals as modulated signals via the dipole antenna. For these examples, transmitter component 522-2 may be arranged to cause the power combine signals to be transmitted via the dipole antenna. Transmitter component 522-2 may be arranged to utilize the outphasing PAs and the dipole antenna in a manner such that the transmitted modulated signals have an average power radiation level of approximately 7 dBs from a peak power radiation level.

Figure 7:
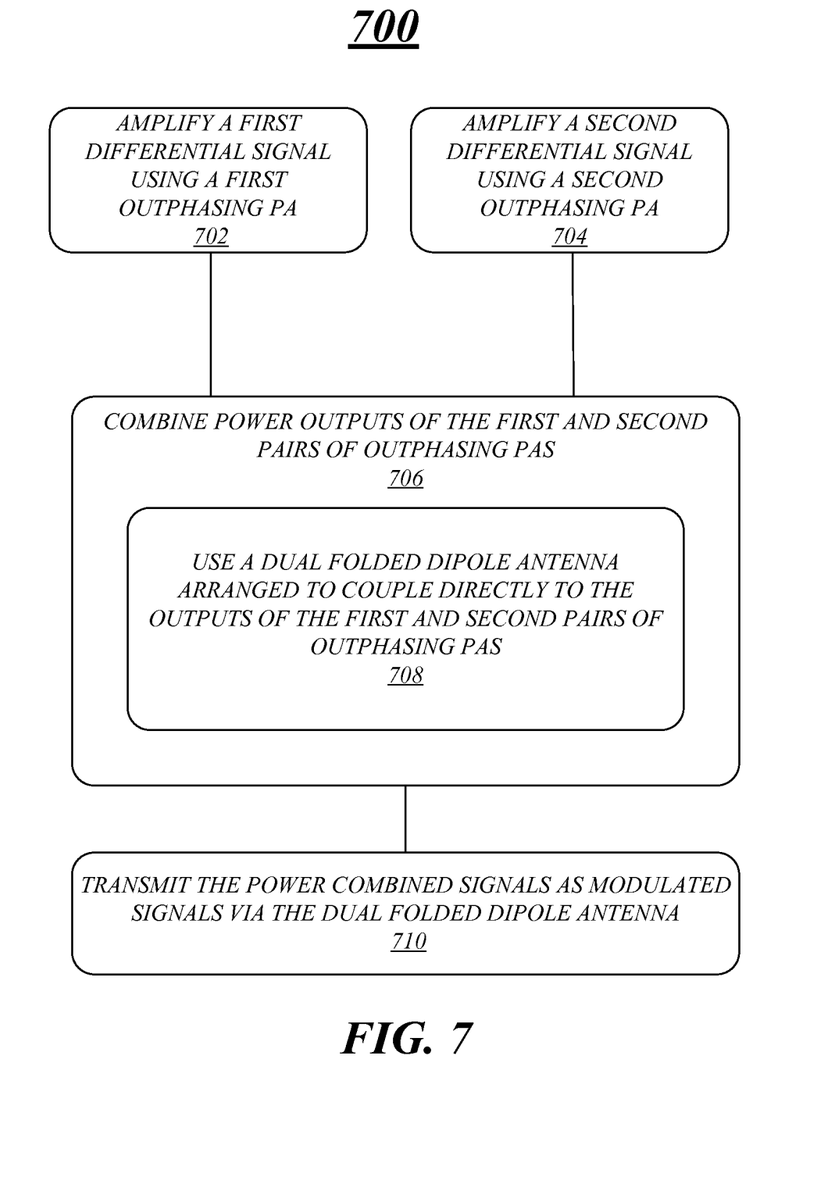
FIG. 7 illustrates an example of a second logic flow.

FIG. 7 illustrates an example of a logic flow 700. Logic flow 700 may be representative of some or all of the operations executed by one or more logic, features, or devices described herein, such as apparatus 500. More particularly, logic flow 700 may be implemented by signal component 522-1 or transmitter component 522-2.

In the illustrated example shown in FIG. 7, logic flow 700 may amplify a first differential signal using a first outphasing pair of PAs at block 702. In some examples, signal component 522-1 of apparatus 500 (e.g., included in wireless device 110) may be arranged to cause the first differential signal to be generated and transmitter component 522-2 may cause the generated first differential signal to be routed through the first pair of outphasing PAs.

In some examples, logic flow 700 at block 704 may amplify a second differential signal using a second pair of outphasing PAs. In some examples, signal component 522-1 may be arranged to cause the second differential signal to be generated and transmitter component 522-2 may cause the generated second differential signal to be routed through the second pair of outphasing PAs. As shown in FIG. 7, blocks 702 and 704 may occur in parallel. In other words, logic flow 700 may amplify the first and second signals at substantially the same time.

According to some examples, logic flow 700 may combine power outputs of the first and second pairs of outphasing PAs at block 706. For these examples, logic flow at block 708 may use a dual folded dipole antenna arranged to couple directly to the outputs of the first and second pairs of outphasing PAs to combine the power outputs.

According to some examples logic flow 700 at block 710 may transmit the power combined signals as modulated signals via the dipole antenna. For these examples, transmitter component 522-2 may be arranged to cause the power combine signals to be transmitted via the dual folded dipole antenna. Transmitter component 522-2 may be arranged to utilize the pairs of outphasing PAs and the dual folded dipole antenna in a manner such that the transmitted modulated signals have an average power radiation level of approximately 7 dBs from a peak power radiation level.

Figure 8:
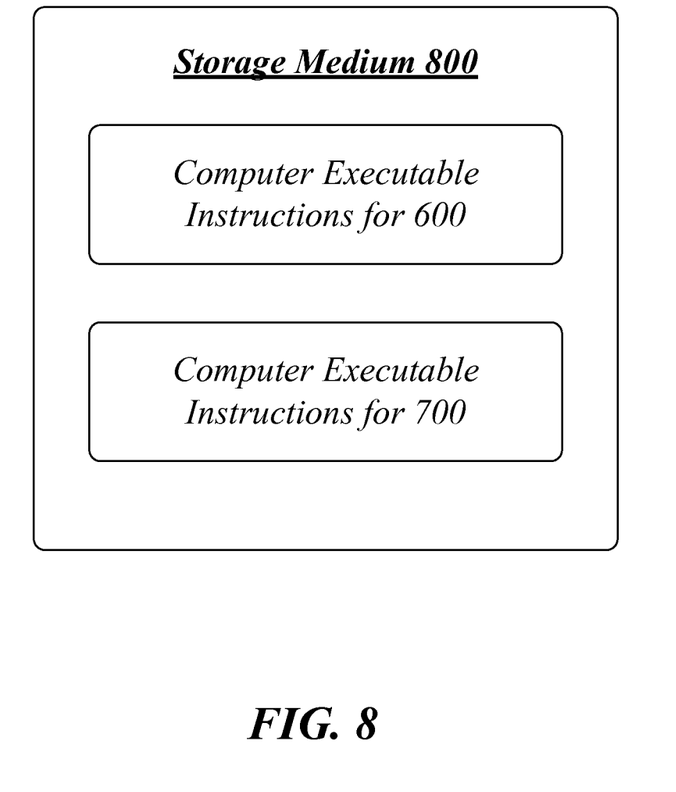
FIG. 8 illustrates an example of a storage medium.

FIG. 8 illustrates an embodiment of a storage medium 800. The storage medium 800 may comprise an article of manufacture. In some examples, storage medium 800 may include any non-transitory computer readable medium or machine readable medium, such as an optical, magnetic or semiconductor storage. Storage medium 800 may store various types of computer executable instructions, such as instructions to implement one or more of the logic flows 600 and/or 700. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 9:
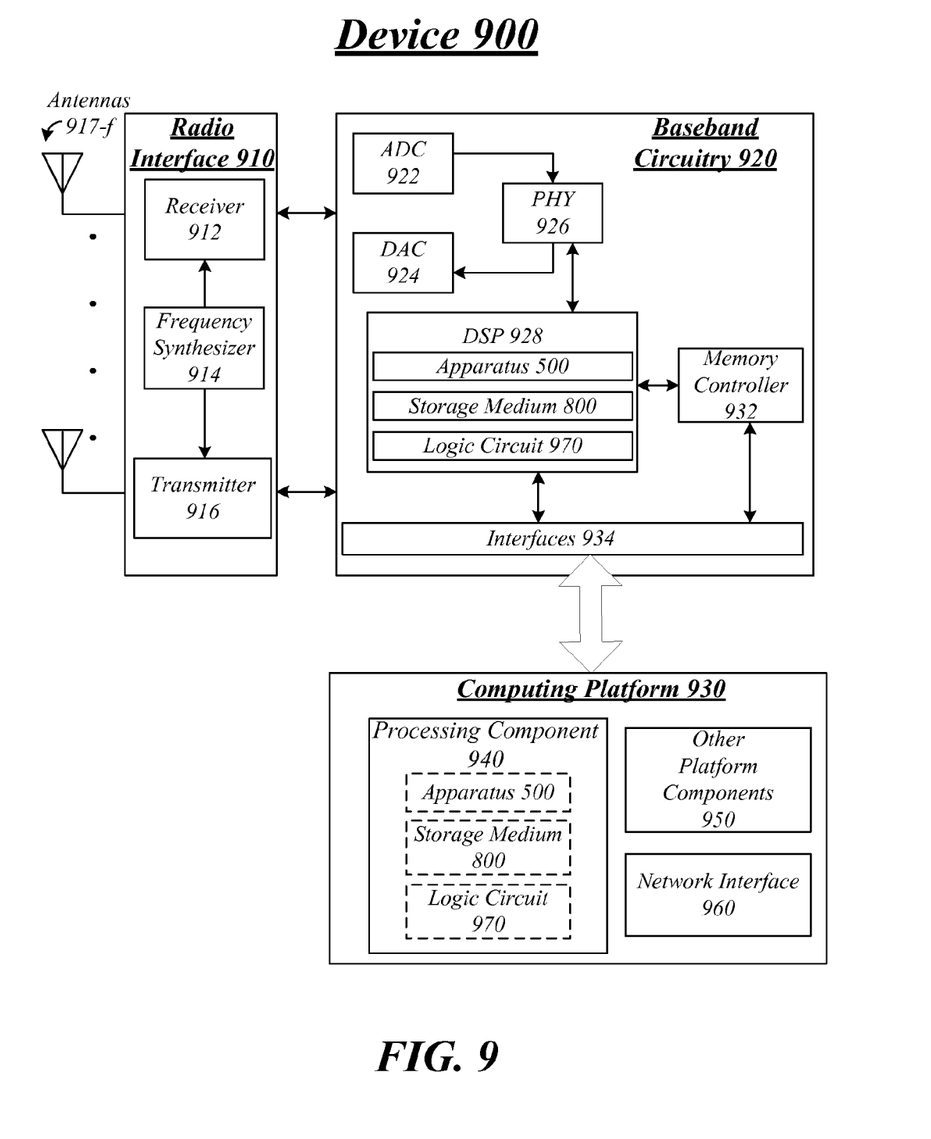
FIG. 9 illustrates an example of a communications architecture for a device.

FIG. 9 illustrates an example of a communications architecture for a device 900. Device 900 may implement, for example, apparatus 500, storage medium 800 and/or a logic circuit 970. The logic circuit 970 may include physical circuits to perform operations described for apparatus 500. As shown in FIG. 9, device 900 may include a radio interface 910, baseband circuitry 920, and computing platform 930, although examples are not limited to this configuration.

The device 900 may implement some or all of the structure and/or operations for the apparatus 500, storage medium 800 and/or logic circuit 970 in a single computing entity, such as entirely within a single device (e.g., within a wireless device). The embodiments are not limited in this context.

In one embodiment, radio interface 910 may include a component or combination of components adapted for transmitting and/or receiving single carrier or multi-carrier modulated signals (e.g., including complementary code keying (CCK) and/or orthogonal frequency division multiplexing (OFDM) symbols) although the embodiments are not limited to any specific over-the-air interface or modulation scheme. Radio interface 910 may include, for example, a receiver 912, a transmitter 916 and/or a frequency synthesizer 914. Radio interface 910 may include bias controls, a crystal oscillator and/or one or more antennas 918-f (e.g., dipole or dual folded dipole types of antennas). In another embodiment, radio interface 910 may use external voltage-controlled oscillators (VCOs), outphasing power amplifiers, surface acoustic wave filters, intermediate frequency (IF) filters and/or RF filters, as desired. Due to the variety of potential RF interface designs an expansive description thereof is omitted.

Baseband circuitry 920 may communicate with radio interface 910 to process receive and/or transmit signals and may include, for example, an analog-to-digital converter 922 for down converting received signals, a digital-to-analog converter 924 for up converting signals for transmission. Further, baseband circuitry 920 may include a baseband or physical layer (PHY) processing circuit 926 for PHY link layer processing of respective receive/transmit signals. Baseband circuitry 920 may include, for example, a processing circuit such as a digital signal processor (DSP) 928. Baseband circuitry 920 may include a memory controller 932 for communicating with DSP 928 and/or a computing platform 930, for example, via one or more interfaces 934.

In some embodiments, PHY processing circuit 926 may include a frame construction and/or detection module, in combination with additional circuitry such as a buffer memory, to construct and/or deconstruct communication frames (e.g., containing subframes). Alternatively or in addition, DSP 928 may share processing for certain of these functions or perform these processes independent of PHY processing circuit 926. In some embodiments, digital signal processing and PHY processing may be integrated into a single circuit.

Computing platform 930 may provide computing functionality for device 900. As shown, computing platform 930 may include a processing component 940. In addition to, or alternatively of, baseband circuitry 920 of device 900 may execute processing operations or logic for apparatus 500, storage medium 800, and logic circuit 970 using the processing component 930. Processing component 940 (and/or PHY 926 and/or DSP 928) may comprise various hardware elements, software elements, or a combination of both. Examples of hardware elements may include devices, logic devices, components, processors, microprocessors, circuits, processor circuits (e.g., processor circuit 920), circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

Computing platform 930 may further include other platform components 950. Other platform components 950 include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information.

Computing platform 930 may further include a network interface 960. In some examples, network interface 960 may include logic and/or features to support communication interfaces described in one or more 3GPP LTE or LTE-A specifications or standards, IEEE 802.16 standards, or IEEE 802.11 standards. For these examples, network interface 960 may enable an apparatus 500 located with a wireless device communicatively couple to wireless communications networks operating in compliance with at least some of the above mentioned specification or standards.

Device 900 may be, for example, user equipment, a computer, a personal computer (PC), a desktop computer, a laptop computer, a notebook computer, a netbook computer, a server, a server array or server farm, a web server, a network server, an Internet server, a work station, a mini-computer, a main frame computer, a supercomputer, a network appliance, a web appliance, a distributed computing system, multiprocessor systems, processor-based systems, wireless access point, base station, node B, subscriber station, mobile subscriber center, radio network controller, router, hub, gateway, bridge, switch, machine, or combination thereof. Accordingly, functions and/or specific configurations of device 900 described herein, may be included or omitted in various embodiments of device 900, as suitably desired. In some embodiments, device 900 may be configured to be compatible with protocols and frequencies associated one or more of the 3GPP LTE Specifications and/or IEEE 802.16 Standards for WMANs, and/or other broadband wireless networks, cited herein, although the examples are not limited in this respect.

Embodiments of device 900 may be implemented using single input single output (SISO) architectures. However, certain implementations may include multiple antennas (e.g., antennas 918-f) for transmission and/or reception using adaptive antenna techniques for beamforming or spatial division multiple access (SDMA) and/or using multiple input multiple output (MIMO) communication techniques.

The components and features of device 900 may be implemented using any combination of discrete circuitry, application specific integrated circuits (ASICs), logic gates and/or single chip architectures. Further, the features of device 900 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary device 900 shown in the block diagram of FIG. 9 may represent one functionally descriptive example of many potential implementations. Accordingly, division, omission or inclusion of block functions depicted in the accompanying figures does not infer that the hardware components, circuits, software and/or elements for implementing these functions would be necessarily be divided, omitted, or included in embodiments.

Figure 10:
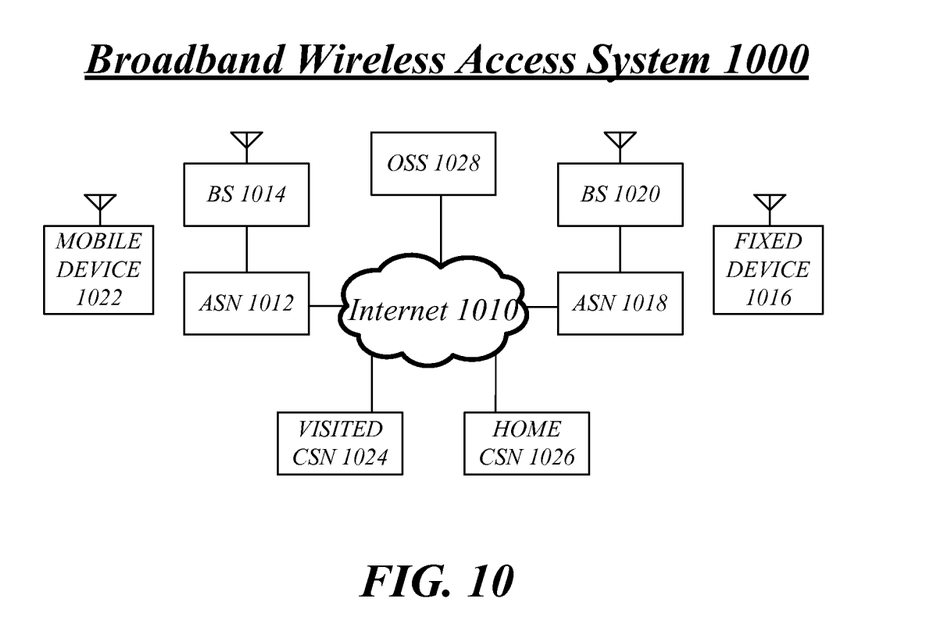
FIG. 10 illustrates an example of a communications system.

FIG. 10 illustrates an embodiment of a broadband wireless access system 1000. As shown in FIG. 10, broadband wireless access system 1000 may be an internet protocol (IP) type network comprising an internet 1010 type network or the like that is capable of supporting mobile wireless access and/or fixed wireless access to internet 1010. In one or more embodiments, broadband wireless access system 1000 may comprise any type of orthogonal frequency division multiple access (OFDMA) based wireless network, such as a system compliant with one or more of the 3GPP LTE Specifications and/or IEEE 802.16 Standards, and the scope of the claimed subject matter is not limited in these respects.

In the exemplary broadband wireless access system 1000, access service networks (ASN) 1014, 1018 are capable of coupling with base stations (BS) 1014, 1020 (or eNBs), respectively, to provide wireless communication between one or more fixed devices 1016 and internet 1010, or one or more mobile devices 1022 and Internet 1010. One example of a fixed device 1016 and a mobile device 1022 is wireless device 100 as mentioned in FIG. 1, with the fixed device 1016 comprising a stationary version of wireless device 100 and the mobile device 1022 comprising a mobile version of wireless device 100. ASN 1012 may implement profiles that are capable of defining the mapping of network functions to one or more physical entities on broadband wireless access system 1000. Base stations 1014, 1020 (or eNBs) may comprise radio equipment to provide RF communication with fixed device 1016 and mobile device 1022, such as described with reference to device 1000, and may comprise, for example, the PHY, MAC, RLC or PDCP layer equipment in compliance with a 3GPP LTE Specification or an IEEE 802.16 Standard. Base stations 1014, 1020 (or eNBs) may further comprise an IP backplane to couple to Internet 1010 via ASN 1012, 1018, respectively, although the scope of the claimed subject matter is not limited in these respects.

Broadband wireless access system 1000 may further comprise a visited connectivity service network (CSN) 1024 capable of providing one or more network functions including but not limited to proxy and/or relay type functions, for example authentication, authorization and accounting (AAA) functions, dynamic host configuration protocol (DHCP) functions, or domain name service controls or the like, domain gateways such as public switched telephone network (PSTN) gateways or voice over internet protocol (VoIP) gateways, and/or internet protocol (IP) type server functions, or the like. However, these are merely example of the types of functions that are capable of being provided by visited CSN 1024 or home CSN 1026, and the scope of the claimed subject matter is not limited in these respects. Visited CSN 1024 may be referred to as a visited CSN in the case where visited CSN 1024 is not part of the regular service provider of fixed device 1016 or mobile device 1022, for example where fixed 1016 or mobile device 1022 is roaming away from their respective home CSN 1026, or where broadband wireless access system 1000 is part of the regular service provider of fixed device 1016 or mobile device 1022 but where broadband wireless access system 1000 may be in another location or state that is not the main or home location of fixed device 1016 or mobile device 1022.

Fixed device 1016 may be located anywhere within range of one or both base stations 1014, 1020, such as in or near a home or business to provide home or business customer broadband access to Internet 1010 via base stations 1014, 1020 and ASN 1012, 1018, respectively, and home CSN 1026. It is worthy to note that although fixed device 1016 is generally disposed in a stationary location, it may be moved to different locations as needed. Mobile device 1022 may be utilized at one or more locations if mobile device 1022 is within range of one or both base stations 1014, 1020, for example.

In accordance with one or more embodiments, operation support system (OSS) 1028 may be part of broadband wireless access system 1000 to provide management functions for broadband wireless access system 1000 and to provide interfaces between functional entities of broadband wireless access system 1000. Broadband wireless access system 1000 of FIG. 10 is merely one type of wireless network showing a certain number of the components of broadband wireless access system 1000, and the scope of the claimed subject matter is not limited in these respects.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled", "connected", or "capable of being coupled" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

According to some examples, an example first apparatus for a wireless device may include a first outphasing power amplifier arranged to amplify a first signal and a second outphasing power amplifier arranged to amplify a second signal. The example first apparatus may also include a dipole antenna arranged to couple directly to the outputs of the first and the second outphasing power amplifiers and also arranged to operate as a power combiner for signals outputted from the first and the second outphasing power amplifiers.

In some examples for the example first apparatus, the dipole antenna may be arranged to transmit the power combined signals as modulated signals. The modulated signals may include OFDM modulated signals. According to some examples, the modulated signals may be transmitted via the dipole antenna at a peak power radiation level based on the first signal being anti-phase relative to the second signal and transmitted at a minimum power radiation level based on the first signal being in-phase relative to the second signal. Also, in some examples, the transmitted modulated signals may have an average power radiation level of approximately 7 decibels (dBs) from a peak power radiation level.

In some examples, first methods implemented at a wireless may include generating a first signal and a second signal and amplifying the first signal using a first outphasing power amplifier and amplifying the second signal using a second outphasing power amplifier. The example first methods may also include combining power outputs of the first and the second outphasing power amplifiers using a dipole antenna arranged to couple directly to the outputs of the first and the second outphasing power amplifiers.

According to some examples, the example first methods may also include transmitting the power combined signals as modulated signals via the dipole antenna. The modulated signals may include OFDM modulated signals. In some examples, the modulated signals may be transmitted at a peak power radiation level based on the first signal being anti-phase relative to the second signal. The modulated signals may also be transmitted at a minimum power radiation level based on the first signal being in-phase relative to the second signal In some examples, at least one machine readable medium including a plurality of instructions that in response to being executed on a computing device may cause the computing device to carry out the example first methods as mentioned above.

In some examples an apparatus or device may include means for performing the example first methods as mentioned above.

According to some examples, an example second apparatus for a wireless device may include a first pair of outphasing power amplifiers arranged to amplify a first differential signal and a second pair of outphasing power amplifiers arranged to amplify a second differential signal. The example second apparatus may also include a dual folded dipole antenna arranged to couple directly to the outputs of the first and the second pairs of outphasing power amplifiers and also arranged to operate as a power combiner for signals outputted from the first and the second pairs of outphasing power amplifiers.

In some examples for the example second apparatus, the dual folded dipole antenna may be arranged to transmit the power combined signals as modulated signals. The modulated signals may include OFDM modulated signals. According to some examples, the modulated signals may be transmitted via the dual folded dipole antenna at a peak power radiation level based on the first differential signal being anti-phase relative to the second differential signal and transmitted at a minimum power radiation level based on the first differential signal being in-phase relative to the second differential signal. Also, in some examples, the transmitted modulated signals may have an average power radiation level of approximately 7 decibels (dBs) from a peak power radiation level.

In some examples, second methods implemented at a wireless may include generating a first and a second differential signal. The first differential signal may be amplified using a first pair of outphasing power amplifiers and the second differential signal may be amplified using a second pair of outphasing power amplifiers. The example second methods may also include combining power outputs of the first and the second pairs of outphasing power amplifiers using a dual folded dipole antenna arranged to couple directly to the outputs of the first and the second pairs of outphasing power amplifiers.

According to some examples, the example second methods may also include transmitting the power combined signals as modulated signals via the dual folded dipole antenna. The modulated signals may include OFDM modulated signals. In some examples, the modulated signals may be transmitted at a peak power radiation level based on the first differential signal being anti-phase relative to the second differential signal. The modulated signals may also be transmitted at a minimum power radiation level based on the first differential signal being in-phase relative to the second differential signal.

In some examples, at least one machine readable medium including a plurality of instructions that in response to being executed on a computing device may cause the computing device to carry out the example second methods as mentioned above.

In some examples an apparatus or device may include means for performing the example second methods as mentioned above.

According to some examples, an example third apparatus for a wireless device may include a processor circuit and a signal component arranged for execution by the processor circuit to cause a first signal and a second signal to be generated. The example third apparatus may also include a transmitter component arranged for execution by the processor circuit to cause the first signal to be routed to a first branch of an outphasing power amplifier system. The transmitter component may also be arranged to cause a second signal to be routed to a second branch of the outphasing power amplifier system. The outputs of the first branch and the second branch may be configurable to couple directly to an antenna arranged to operate as a power combiner for signals outputted from the first and the second branches.

According to some examples, the example third apparatus may also include the transmitter component to cause a power combined signal to be transmitted from the antenna. The power combined signal may be transmitted as modulated signals. The modulated signals may include OFDM modulated signals. Also, the modulated signals may be transmitted at a peak power radiation level based on the first signal being anti-phase relative to the second signal or transmitted at a minimum power radiation level based on the first signal being in-phase relative to the second signal.

In some examples for the example third apparatus, the antenna may be a dipole antenna. For these examples, the first branch may include a first outphasing power amplifier and the second branch may include a second outphasing power amplifier. The outputs of the first and the second outphasing amplifiers may directly couple to the dipole antenna.

In some examples for the example third apparatus, the antenna may be a dual folded dipole antenna. For these examples, the first signal routed to the first branch may include a first differential signal. The first branch may include a first pair of outphasing power amplifiers arranged to receive the first differential signal. The second signal routed to the second branch may include a second differential signal. The second branch may include a second pair of outphasing power amplifiers arranged to receive the second differential signal. The dual folded dipole antenna may be arranged to directly couple to the outputs of the first and the second pairs of outphasing amplifiers.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus for a wireless device comprising:
a first outphasing power amplifier arranged to amplify a first signal;
a second outphasing power amplifier arranged to amplify a second signal; and
a dipole antenna arranged to:
couple directly to the outputs of the first and the second outphasing power amplifiers,
operate as a power combiner for signals outputted from the first and the second outphasing power amplifiers, and
transmit the power combined signals as modulated signals, the modulated signals transmitted via the dipole antenna at a peak power radiation level based on the first signal being anti-phase relative to the second signal and transmitted at a minimum power radiation level based on the first signal being in-phase relative to the second signal.

2. The apparatus of claim 1, the modulated signals comprising orthogonal frequency-division multiplexing modulated signals.

3. The apparatus of claim 1, comprising the transmitted modulated signals having an average power radiation level of approximately 7 decibels (dBs) from a peak power radiation level.

4. A method implemented at a wireless device comprising:
generating a first and second signal;
amplifying the first signal using a first outphasing power amplifier;
amplifying the second signal using a second outphasing power amplifier; and
combining power outputs of the first and the second outphasing power amplifiers using a dipole antenna arranged to couple directly to the outputs of the first and the second outphasing power amplifiers;
transmitting the power combined signals as modulated signals via the dipole antenna; and
transmitting the modulated signals at a peak power radiation level based on the first signal being anti-phase relative to the second signal or transmitting the modulated signals at a minimum power radiation level based on the first signal being in-phase relative to the second signal.

5. The method of claim 4,
the modulated signals to include orthogonal frequency-division multiplexing modulated signals.

* * * * *